United States Patent [19]
Tagami et al.

[11] Patent Number: 4,791,319
[45] Date of Patent: Dec. 13, 1988

[54] SEMICONDUCTOR DEVICE WITH REDUNDANCY CIRCUIT AND MEANS FOR ACTIVATING SAME

[75] Inventors: Tomoyuki Tagami; Masaru Nawaki, both of Nara, Japan

[73] Assignee: Sharp Kabushiki Kaisha, Osaka, Japan

[21] Appl. No.: 44,105

[22] Filed: Apr. 29, 1987

[30] Foreign Application Priority Data

Jun. 20, 1986 [JP] Japan ................. 61-145582

[51] Int. Cl.⁴ .............................. H03K 19/003
[52] U.S. Cl. .................... 307/441; 307/202.1; 307/449; 307/469
[58] Field of Search ........... 307/441, 202.1, 219, 307/449, 468–469; 365/200

[56] References Cited
U.S. PATENT DOCUMENTS

| | | | |
|---|---|---|---|
| 4,441,170 | 4/1984 | Folmsbee et al. | 365/200 |
| 4,546,455 | 10/1985 | Iwahashi et al. | 307/202.1 X |
| 4,613,959 | 9/1986 | Jiang | 307/219 X |
| 4,641,285 | 2/1987 | Sasaki et al. | 365/200 X |
| 4,658,379 | 4/1987 | Fujishima et al. | 365/200 |
| 4,691,300 | 9/1987 | Pelley III et al. | 365/200 |

FOREIGN PATENT DOCUMENTS 0091726  5/1984  Japan .................... 307/441

Primary Examiner—Stanley D. Miller
Assistant Examiner—D. R. Hudspeth
Attorney, Agent, or Firm—Flehr, Hohbach, Test, Albritton & Herbert

[57] ABSTRACT

A semiconductor device such as a DRAM with many signal line circuits is also provided with a redundancy circuit and is so structured that when one of the signal line circuits is defective and the fuse contained by such a defective signal line circuit is cut off to inactivate it, an input signal which would select the inactivated signal line circuit will automatically select the redundancy circuit.

2 Claims, 2 Drawing Sheets

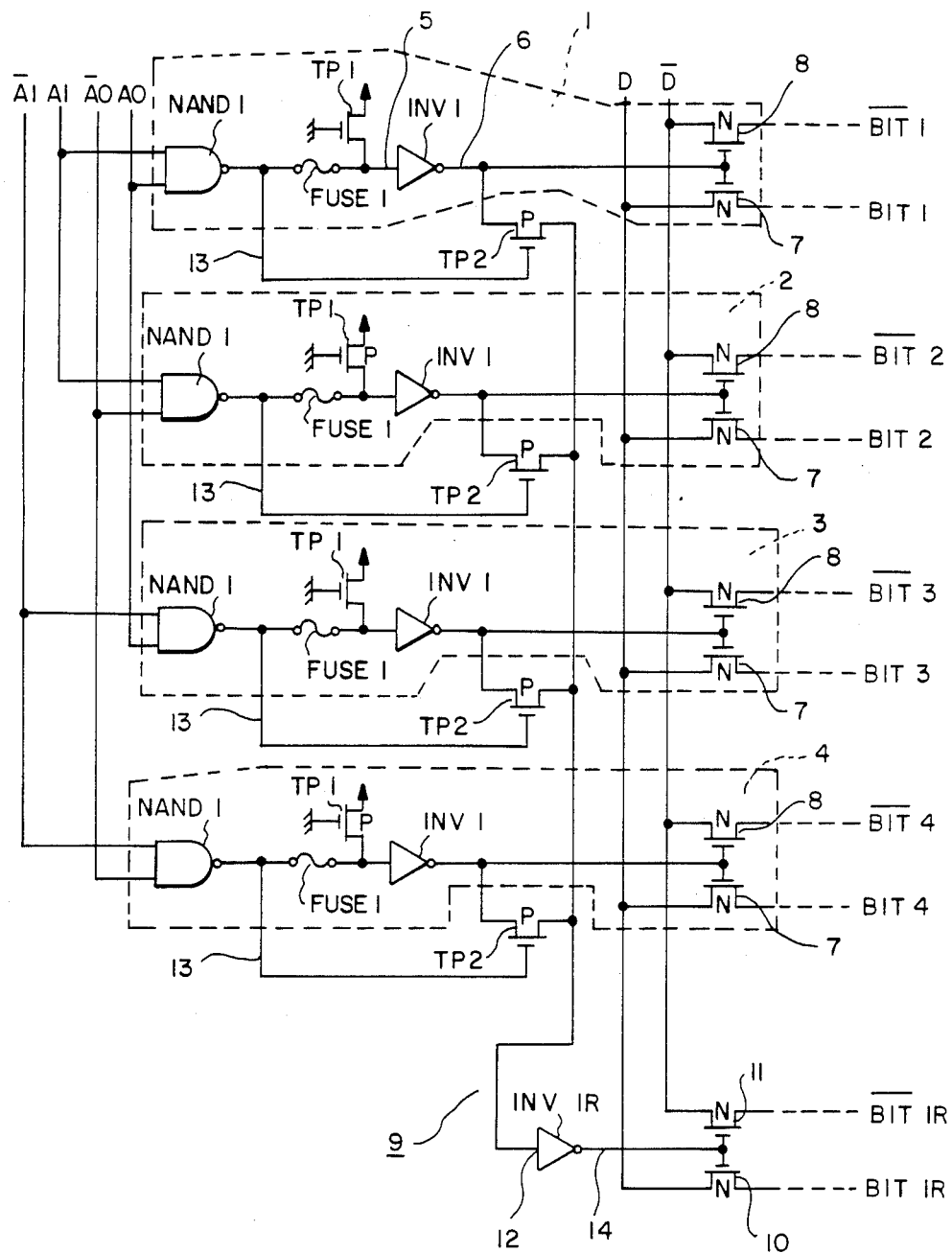
FIG.—1

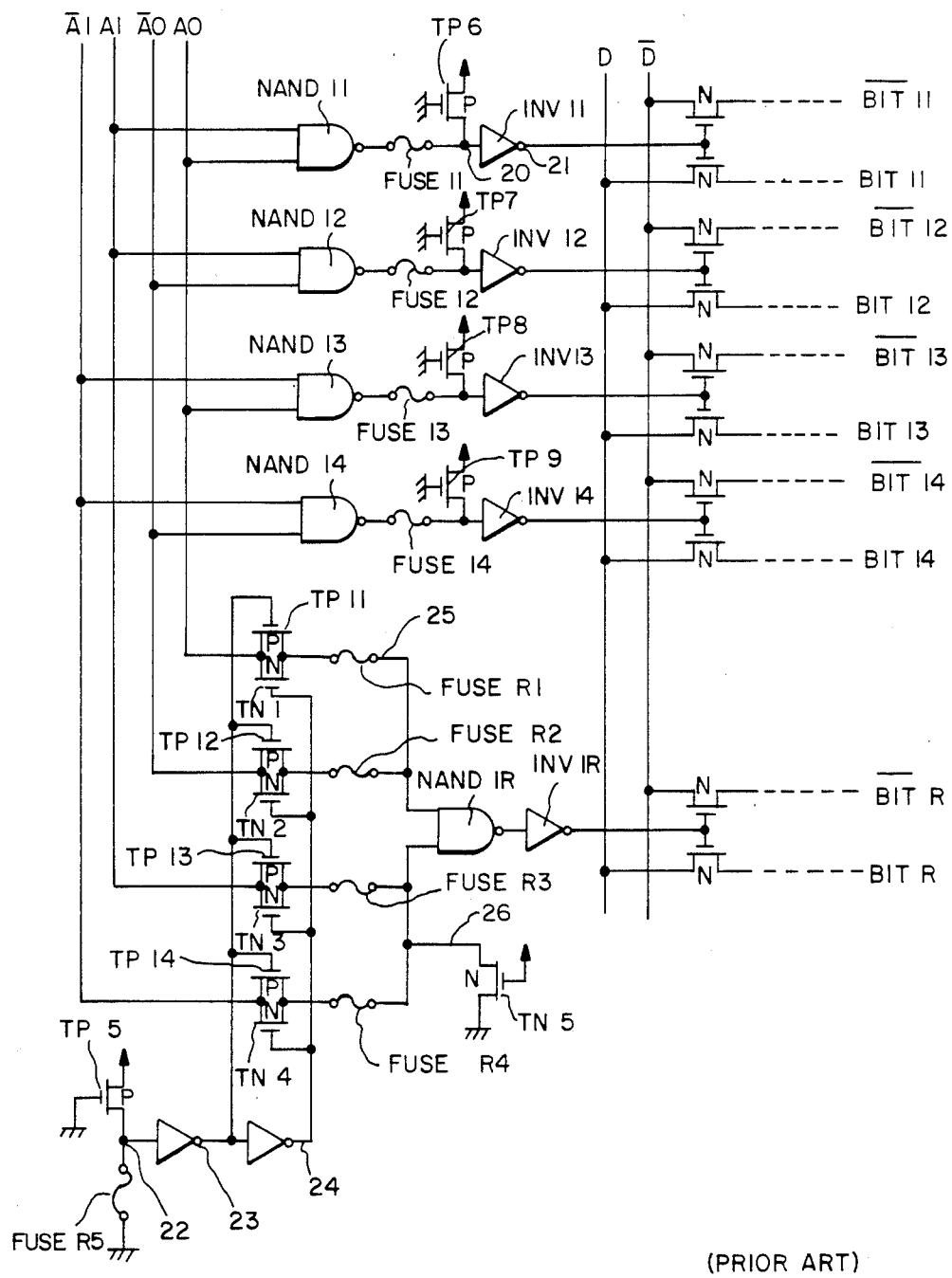
FIG. — 2 (PRIOR ART)

SEMICONDUCTOR DEVICE WITH REDUNDANCY CIRCUIT AND MEANS FOR ACTIVATING SAME

BACKGROUND OF THE INVENTION

This invention relates to a semiconductor device with spare signal line circuits or so-called redundancy circuits for salvaging bits containing defective signal lines.

The yield of semiconductor devices such as memory devices like DRAMs usually becomes low if an attempt is made to increase their memory capacity by miniaturizing them, to make their production process more complicated or to increase their chip size. In order to prevent such a drop in the yield, it has been known to provide memory chips not only with the ordinary bit lines, word lines and memory cells but also with spare bit lines, word lines and memory cells or the so-called redundancy lines such that a defective component which is originally intended for use can be replaced by a spare component. A certain fraction of chips which would otherwise be deemed defective can be saved by such replacement before they are packaged. The conventional method of replacing a defective line has been to activate a spare bit line or word line, assigning thereto the same address as that of the defective line and to inactivate the bit line or word line of the defective bit.

FIG. 2 is a circuit diagram of a conventional redundancy circuit by way of which a static method of using redundancy lines is explained below. For the purpose of simplifying the explanation, 2-bit addresses are considered. In FIG. 2, bit lines originally intended for use are BIT11, $\overline{BIT11}$–BIT14, $\overline{BIT14}$ while BITR and $\overline{BITR}$ represent redundant bit lines. Let us now consider the situation where the pair of bit lines $\overline{BIT11}$ and BIT11 is defective and to be replaced respectively by the redundancy bit lines $\overline{BITR}$ and BITR. First, the fuse FUSE11 is cut off in order to inactivate the bit lines BIT11 and $\overline{BIT11}$. Since this cuts off the signals from the NAND gate NAND11, the voltage level at the node 20 becomes "H" because of the transistor TP6 with a small $\beta$ value while the node 21 becomes "L" through the inverter gate INV11. As a result, the bit lines BIT11 and $\overline{BIT11}$ become disconnected forever electrically from the data lines D and $\overline{D}$. Next, when the fuse FUSER5 is cut off in order to activate redundant lines corresponding to the bit lines BIT11 and $\overline{BIT11}$, the node 22 becomes "H" similarly because of the transistor TP5 with a small $\beta$ value and the nodes 23 and 24 respectively become "L" and "H" such that all transistors TP11–TP14 and TN1–TN4 become transmissive and the address signals $A_0$, $\overline{A_0}$, $A_1$ and $\overline{A_1}$ are respectively transmitted to the nodes 25 and 26. In addition, the fuses FUSER2 and FUSER4 are cut off in order to eliminate the unwanted address signals $\overline{A_0}$ and $\overline{A_1}$ such that the bit lines BIT11 and $\overline{BIT11}$ become inactive and redundant bit lines BITR and $\overline{BITR}$ become active.

A disadvantage associated with the circuit shown in FIG. 2 is that many large elements such as the fuses FUSER1–FUSER5 are required in the redundancy circuit. This means that the area on a chip occupied by the redundancy circuit becomes large and since a large number of fuses must be cut off according to the method of operation described above, a long time period is wasted in the replacement, resulting in an increase in the cost of the product.

SUMMARY OF THE INVENTION

It is therefore an object of the present invention to provide a semiconductor device with a redundancy circuit with which the chip area need not be increased and the time required for replacement operation can be reduced.

The above and other objects of the present invention are achieved by providing a semiconductor device such as a DRAM having many signal line circuits each containing a fuse and a redundancy circuit connected in such a way that when the fuse of a defective one of the signal line circuits is cut off to inactivate it, the redundancy circuit automatically becomes selected by a signal which would select the defective signal line circuit if its fuse has not been cut.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings:

FIG. 1 is a circuit diagram of a semiconductor memory device with a redundancy circuit embodying the present invention, and FIG. 2 is a circuit diagram of a conventional type of semiconductor device with redundancy circuits.

DETAILED DESCRIPTION OF THE INVENTION

An embodiment of the present invention is described below but the present invention is not intended to be limited by this illustrative example.

In FIG. 1, numerals 1, 2, 3 and 4 indicate signal line circuits. The first signal line circuit 1 includes a NAND gate NAND1 of which the input terminals are connected to address buses $A_1$ and $A_0$, a circuit opening element (hereinafter referred to as a fuse) FUSE1 connected to the output terminal of the NAND gate NAND1, an inverter gate INV1 with a node 5 defined between the inverter gate INV1 and the fuse FUSE1, transistors 7 and 8 which are connected to the node 6 on the output side of the inverter gate INV1 for a switching control and are adapted to connect bit line BIT1 with data D and bit line $\overline{BIT1}$ with data line $\overline{D}$ when switched on and another transistor TP1 for setting the node 5 at "H" voltage level. Each of the other signal line circuits 2, 3 and 4 is structured identically. Corresponding components in these circuits are indicated by the same symbols.

The input terminals of the NAND gate NAND1 of the second signal line circuit 2 are connected to the address buses $A_1$ and $\overline{A_0}$, those of the NAND gate NAND1 of the third signal line circuit 3 are connected to the address buses $\overline{A_1}$ and $A_0$, and those of the NAND gate NAND1 of the fourth signal line circuit 4 are connected to the address buses $\overline{A_1}$ and $\overline{A_0}$. Similarly, the transistors 7 and 8 of the second signal line circuit 2 are adapted to connect the data line $\overline{D}$ with bit line BIT2 and the data line $\overline{D}$ with bit line $\overline{BIT2}$, those of the third signal line circuit 3 are adapted to connect the data line D with bit line BIT3 and the data line $\overline{D}$ with bit line $\overline{BIT3}$, and those of the fourth signal line circuit 4 are adapted to connect the data line D with bit line BIT4 and the data line $\overline{D}$ with bit line $\overline{BIT4}$.

Numeral 9 indicates a spare signal line circuit. The spare signal line circuit 9 includes transistors 10 and 11 adapted to connect the data line D with a spare bit line BIT1R and the data line $\overline{D}$ with another spare bit line $\overline{BIT1R}$ when switched on, and an inverter gate INV1R for controlling the switching of the transistors 10 and 11. Additional transistors TP2 are individually provided to the signal line circuits 1, 2, 3 and 4, each serving, when switched on, to connect the node 6 of the corresponding signal line circuit 1, 2, 3, or 4 with its node 12. Numerals 13 each indicate a selection circuit which serves to transmit the output of a NAND gate NAND1 to the corresponding transistor TP2.

In what follows, operation of the circuits shown in FIG. 1 and the method of replacement are explained in detail. Let us assume that addresses are given in two bits as done in connection with the description of the conventional circuit of FIG. 2, and consider first a situation where there is no defect in the four signal line circuits 1, 2, 3 and 4 and the bit line $\overline{BIT1}$ is the one to be selected. In this situation, address buses $A_1$ and $A_0$ are both at "H" levels and only the output from the NAND gate NAND1 of the first signal line circuit 1 becomes "L".

With consideration given only to the first signal line circuit 1, the aforementioned "L" signal from the NAND gate NAND1 causes the inverter gate INV1 to output an "H" signal. The transistors 7 and 8 are thereby switched on and the bit lines BIT1 and $\overline{BIT1}$ are selected as explained above. Since the transistor TP2 is also in the ON condition in this situation, however, the node 12 in the redundancy circuit 9 becomes "H" and the node 14 is "L" such that the spare bit lines BIT1R and $\overline{BIT1R}$ are not selected. The bit lines BIT2-BIT4 and $\overline{BIT2}$-$\overline{BIT4}$ corresponding to the other signal line circuits 2, 3 and 4 are likewise not selected because the outputs from the NAND gates NAND1 in these signal line circuits 2, 3 and 4 are all "H", causing the outputs from the corresponding inverter gates INV1 to be "L". The transistors TP2 corresponding to these signal line circuits 2, 3 and 4 are also in the OFF condition.

Next, let us consider the situation where the bit line BIT1 and/or bit line $\overline{BIT1}$ is defective. In this situation, the fuse FUSE1 is cut off, for example, by a laser light in order to replace the bit lines BIT1 and $\overline{BIT1}$ by spare bit lines BIT1R and $\overline{BIT1R}$. Thereafter, the node 5 becomes "H" because of the transistor TP1 and the node 6 becomes "L". This means that the bit lines BIT1 and $\overline{BIT1}$ are inactivated forever and not selected. On the other hand, since the output from the NAND gate NAND1 is "L" and the transistor TP2 is in the ON condition, the nodes 12 and 14 respectively become "L" and "H" such that the spare bit lines BIT1R and $\overline{BIT1R}$ are selected.

Thereafter, if the address buses $A_0$ and $A_1$ become "L" and "H", respectively, to select the bit lines BIT2 and $\overline{BIT2}$, the output of the NAND gate NAND1 of the second signal line circuit 2 becomes "L", thereby switching on the transistor TP2 corresponding to the second signal line circuit 2. Since the node 6 in the second signal line circuit 2 is "H" at this moment, however, "H" signal is received at the node 12 of the redundancy circuit 9. This places the node 14 in the "L" level and the spare bit lines BIT1R and $\overline{BIT1R}$ are not selected.

The foregoing description of a preferred embodiment of the invention has been presented for purposes of illustration and description. It is not intended to be exhaustive or to limit the invention to the precise form disclosed, and many modifications and variations are possible in light of the above teaching. For example, the present invention is not limited to situations with 2-bit address signals. The circuit of FIG. 1 can be easily modified for applications to 8-bit, 16-bit or even 32-bit microcomputers. Any conductive substance which can be cut off by the heat of laser light may be used as the circuit opening elements. The present invention is characterized as requiring no elements such as a decoder circuit or a fuse for the selection of the redundancy lines and enabling a replacement operation to be completed easily merely by inactivating the defective section. As a result, the chip area need not be increased to accommodate a selection circuit. The time required for replacement can be shortened and the cost of chips can be reduced.

What is claimed is:
1. A semiconductor device comprising
   a plurality of signal line circuits each including a selecting line for transmitting a line selecting signal therethrough and a normally closed circuit opening element, and
   a redundancy signal line circuit connected to each of said signal line circuits through a single transistor, said circuit opening element connecting the gate of said transistor in series with said selecting line of said signal line circuit, said device being so structured that a defective one of said signal line circuits can be inactivated by opening said circuit opening element in said defective signal line circuit and that a signal applied to said inactivated signal line circuit serves to activate said redundancy signal line circuit.
2. The semiconductor device of claim 1 wherein said circuit opening element is a fuse which can be opened by a laser.

* * * * *